United States Patent
Jost et al.

(10) Patent No.: US 8,409,991 B2
(45) Date of Patent: Apr. 2, 2013

(54) METHOD FOR MANUFACTURING LARGE-AREA VACUUM PLASMA TREATED SUBSTRATES AND VACUUM PLASMA TREATMENT APPARATUS

(75) Inventors: Stephan Jost, Azmoos (CH); Andreas Belinger, Azmoos (CH)

(73) Assignee: Oerlikon Solar AG, Trubbach, Trubbach (CH)

( * ) Notice: Subject to any disclaimer, the term of this patent is extended or adjusted under 35 U.S.C. 154(b) by 146 days.

(21) Appl. No.: 12/808,192

(22) PCT Filed: Dec. 19, 2008

(86) PCT No.: PCT/EP2008/068020
§ 371 (c)(1),
(2), (4) Date: Jun. 15, 2010

(87) PCT Pub. No.: WO2009/080751
PCT Pub. Date: Jul. 2, 2009

(65) Prior Publication Data
US 2010/0264118 A1    Oct. 21, 2010

Related U.S. Application Data

(60) Provisional application No. 61/015,332, filed on Dec. 20, 2007.

(51) Int. Cl.
*H01L 21/302* (2006.01)
*H01L 21/461* (2006.01)

(52) U.S. Cl. ........ 438/689; 438/706; 438/707; 438/710; 438/711; 438/714

(58) Field of Classification Search .................. None
See application file for complete search history.

(56) References Cited

U.S. PATENT DOCUMENTS

| 5,981,899 | A | 11/1999 | Perrin et al. |
| 6,281,469 | B1 * | 8/2001 | Perrin et al. ............. 219/121.43 |
| 6,353,201 | B1 | 3/2002 | Yamakoshi et al. |
| 6,676,802 | B2 | 1/2004 | Roth |
| 2003/0029566 | A1 * | 2/2003 | Roth ........................ 156/345.35 |

FOREIGN PATENT DOCUMENTS

| EP | 0949352 A1 | 10/1999 |
| JP | 11-354460 A | 12/1999 |
| WO | 2006120239 A1 | 11/2006 |

OTHER PUBLICATIONS

International Search Report for PCT/EP2008/068020 dated May 11, 2009.
Written Opinion for PCT/EP2008/068020 dated May 11, 2009.

* cited by examiner

*Primary Examiner* — Duy Deo
(74) *Attorney, Agent, or Firm* — Pearne & Gordon LL

(57) ABSTRACT

A large surface substrate ($5$, $5_a$) is Rf vacuum plasma treated with the help of an electrode arrangement ($9$) consisting of an even number of electrode strips ($9_a$, $9_b$). At least one of the strips is Rf supplied at least two distinct loci ($P_1$, $P_2$) along the central axis (A) of the addressed strip ($9_a$).

12 Claims, 4 Drawing Sheets

Figure 1:
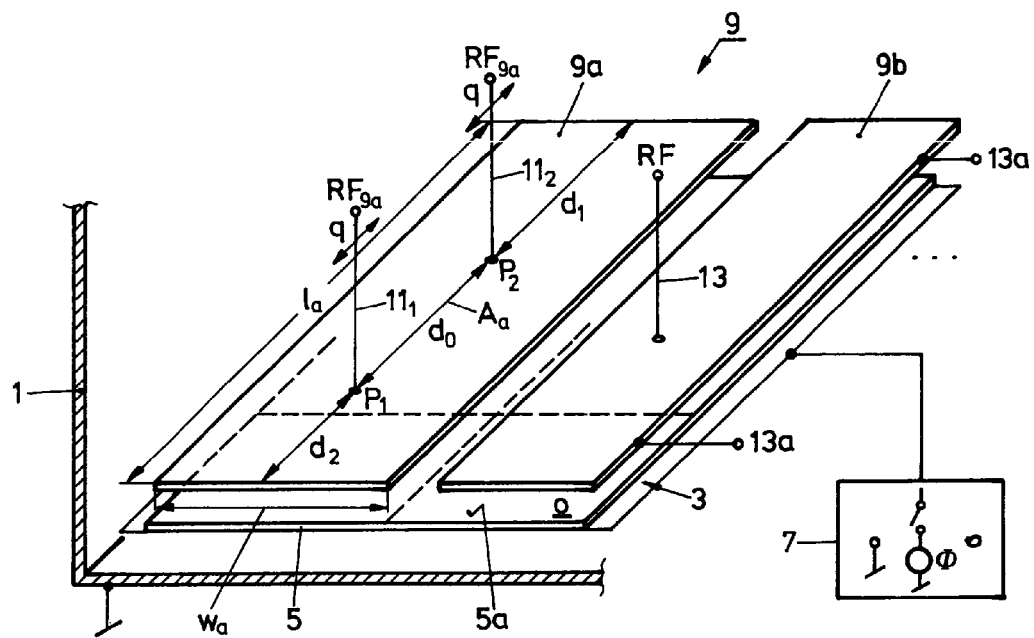

METHOD FOR MANUFACTURING LARGE-AREA VACUUM PLASMA TREATED SUBSTRATES AND VACUUM PLASMA TREATMENT APPARATUS

The present invention departs from the problem of achieving a homogeneous treatment distribution of surfaces of substrates.

Thereby, either one substrate with a surface to be treated of at least 1 m$^2$ is addressed or a multitude of substrates which are to be simultaneously treated and which commonly provide for a surface to be treated of at least 1 m$^2$.

We further understand under the term "treatment" of a surface all kinds of treatment in which the surface is directly exposed to plasma, as plasma-assisted etching and especially plasma-assisted coating. We especially address plasma enhanced chemical vapor deposition (PECVD). Thereby, the present invention is further directed on vacuum plasma treatments with the help of Rf plasma.

Generically, achieving a homogeneous surface treatment on substrates with the help of Rf plasma is a problem addressed since long. Since the requirements on homogeneous surface treatment and thereby especially on homogeneous thickness and material distribution along such surfaces being coated increases, the addressed problem remains to be resolved under ongoingly rising requirements.

The Article "Problems of Power Feeding in Large Area PECVD of Amorphous Silicon" by U. Stephan in Mat. Res. Soc. Symp. Proc. Vol. 557, 1999, Material Research Society, gives a good overview over known approaches to resolve the addressed problems of surface treatment homogeneity. Although being specifically directed on PECVD amorphous silicon deposition, the approaches taught therein are valid for all kinds of surface treatments in which the addressed surface is directly exposed to Rf plasma. It must be noted that rather recent developments in such Rf plasma appliances show the tendency of making use of significantly higher frequencies than were formerly used. Whereas formerly is was customary to supply Rf plasma in the Rf range by a standard Rf frequency of 13.56 MHz, today Rf frequencies are significantly increased, e.g. to 40 MHz and more.

It is customary to expose the addressed surfaces of substrates to be treated directly to a distant and substantially plane electrode arrangement which is electrically fed by one or by a multitude of electrical Rf signals establishing the Rf plasma.

When we speak of a "substantially plane" electrode arrangement this is not to be understood as exclusively defining for a unitary plate-like electrode with a plane surface, but is merely to be understood as an arrangement arranged along a geometric plane.

In the addressed article of U. Stephan et al. the occurrence of standing waves along such electrode arrangements is addressed and several solutions are taught for reducing such occurrence and thereby its negative effect upon homogeneous thickness distribution of layers deposited on large surfaces of substrates. One approach which substantially accords with approaches as taught in the U.S. Pat. No. 5,981,899 as well as with an approach according to the WO 2006/120239 consists in providing an electrode arrangement which consists of a multitude of distinct electrodes which are in groups or individually fed by electrical Rf supply signals.

One approach which is taught in the addressed article is to provide a single large area electrode and to electrically supply such electrode at different supply points. For a single strip-like extending electrode it is taught to electrically feed such strip at multiple distinct supply points along the central axis of the strip so as to improve the homogeneity of treatment of a substrate surface exposed to such strip electrode. Thereby and due to the fact that the addressed electrode is strip-shaped, large surface areas of substrates may only be treated by moving the substrate relative to the electrode strip.

A further approach which makes use of multiple distinct supply points to an electrode, which does not necessitate relative movement of substrate and electrode provides for a large unitary electrode plate having multiple supply points along the electrode periphery.

The results with respect to Rf voltage distribution along the respective electrodes as taught in the addressed article show that the large electrode which does not necessitate relative movement of substrate and electrode are significantly worse than the results achieved by the multiple-point supply strip electrode which does necessitate mutual movement of the substrate and the electrode. The relative movement of substrate and electrode results in a substantially longer processing time for large surfaces, because only a part of the addressed surface is treated at a time. Making use of two-dimensionally extended large electrode leads to simultaneous treatment of the entire large surface, nevertheless at a reduced homogeneity of treatment distribution.

It is an object of the present invention to provide for a method of manufacturing plasma treated substrates. On one hand an improved homogeneity of surface treatment distribution shall be achieved, on the other hand a most economic surface treatment in terms of throughput.

This is realized by a method as addressed which comprises exposing in a vacuum recipient a substrate surface of at least 1 m$^2$ to a substantially plane and distant electrode pattern which consists of an even number of parallel, mutually distant electrode strips of substantially equal length. Rf plasma discharge energy is fed to at least one of the addressed strips at least at two distinct supply loci along the length axis of the strip. The substrate is treated by plasma established with the addressed electrode pattern.

In another aspect of the invention, the electrode pattern consists of N$_e$ parallel, mutually distant electrode strips of substantially equal length, and the Rf is supplied in an odd number of phases, in particular in at least three phases. Therein, N$_e$ is an integer multiple of the number of phases.

When we address electrode strips of "substantially equal" length we understand such lengths to be equal within the range of ±10% of an average value of such lengths.

When we further speak of "plasma" established with the electrode pattern we do not specify whether the overall plasma discharge at the addressed electrode pattern is to be considered as one plasma or as a multitude of plasmas.

Due to the combination of an even number of mutually parallel electrode strips and of supplying Rf energy to at least one of the addressed strips at multiple distinct loci along the length axis of the strip, it becomes possible to significantly improve the homogeneity of the simultaneous treatment of the addressed large surface area, thereby simultaneously treating the entire surface and thus providing for a high throughput.

In one embodiment the loci along the addressed length axis have an average of mutual distance s and the outermost loci are distant from the respective small edges of the strip by s/2±10%.

In a further embodiment there are provided at least three of the addressed loci along the axis and the mutual distances of the at least three loci are selected to be in the range of s±10%.

Still in a further embodiment which may be combined with each of the embodiments addressed, distinct loci at which Rf plasma discharge energy is supplied, are provided along the respective length axis of at least two of the addressed strips, thereby, in a further embodiment, along the length axis of at least a predominant number of the addressed strips, which means upon more than 50% of the number of the strips.

In a further embodiment the plasma discharge energy is generated having a maximum energy at a predetermined frequency $f_o$. This means that considering the spectral distribution of the discharge energy, at frequency $f_o$ the spectral energy is higher than the spectral energy at neighboring spectral locations. The frequency $f_o$ corresponds to a wavelength $\lambda_o$ of the discharge energy (or Rf signal). In this embodiment at least one of the addressed average s and of a width of the strips is selected to be at most 1/10 of this wavelength $\lambda_o$. The wavelength $\lambda_o$ can in many cases be approximated by the wavelength $\lambda_o^* = c/f_o$, also referred to as free space wavelength, wherein c is the speed of light in vacuum. Nevertheless, in reality, wavelength $\lambda_o$ can deviate from the free space wavelength $\lambda_o^*$ depending on materials and geometries involved.

Still in a further embodiment which may be combined with one or more than one of the addressed embodiments the location of the loci is adjustable.

Still in a further embodiment which may be combined with one or more than one of the embodiments addressed above, the number of strips is subdivided in at least two sub-sets of strips and supplying the strips of the sub-sets is performed with electric Rf signals respectively which add to a zero signal.

Thereby, a significant advantage is reached in that no additional Rf current back-path is necessary, back to the generator arrangement.

In a further embodiment of the method according to the invention which may be combined with one or more than one of the embodiments addressed, plasma treating is selected to be non-reactive or to be reactive etching or layer deposition.

Still in a further embodiment which may be combined with one or more than one of the embodiments addressed, layer deposition is done by plasma-enhanced chemical vapor deposition.

The object as outlined above is further resolved by a vacuum plasma treatment apparatus which comprises a vacuum recipient, a substrate support within the recipient for at least one flat substrate arrangement having a surface to be treated of at least 1 m².

The vacuum plasma treatment apparatus further comprises a substantially plane electrode pattern which is distant from the substrate support and which consists of an even number of mutually distant, parallel electrode strips. At least one of the addressed strips has at least two electric supply lines connected at distinct loci along the length axis of the strip.

In another aspect of the invention, the electrode pattern consists of $N_e$ mutually distant, parallel electrode strips, wherein $N_e$ is an odd number with $N_e \geq 3$.

In one embodiment of the apparatus according to the invention the loci have a mutual average distance s and the outermost loci have a distance of $s/2 \pm 20\%$, in particular $s/2 \pm 10\%$ from the small edges of the strip.

In a further embodiment of the apparatus according to the invention which may be combined with one or more than one of the other embodiments, the at least one electrode strip has at least three of the electric supply lines, whereby the mutual distances of the loci differ from an average s of said mutual distances by at most 20% s, in particular by at most 10% s.

Still in a further embodiment of the apparatus, which may be combined with one or more than one of the other embodiments, at least two of the addressed strips, thereby, in a further embodiment, a predominant number of the addressed strips, have the supply and loci as addressed.

Still in a further embodiment, which may be combined with one or more than one of the other embodiments addressed, there is provided an Rf generator arrangement for electric plasma discharge energy. The generator arrangement generates at least one electric supply signal with a maximum spectral energy at a predetermined frequency $f_o$. Thereby, at least one of an average of mutual distance of the addressed loci and a width of the strips is at most 1/10 of the wavelength $\lambda_o$ corresponding to the frequency $f_o$.

In a further embodiment, which may be combined with one or more than one of the other embodiments, the location of at least a part of the addressed distinct loci is adjustable along the strip.

Still in a further embodiment, which may be combined with one or more than one of the other embodiments, there is provided an Rf generator arrangement for electric plasma discharge energy, which has at least two outputs, one of these outputs being operationally connected to one sub-set of the number of electrode strips, a further output being operationally connected to a further sub-set of the addressed number of electrode strips, signals applied to the sub-sets in dependency from signals generated at the addressed outputs adding to a substantially zero signal.

Figure 2:
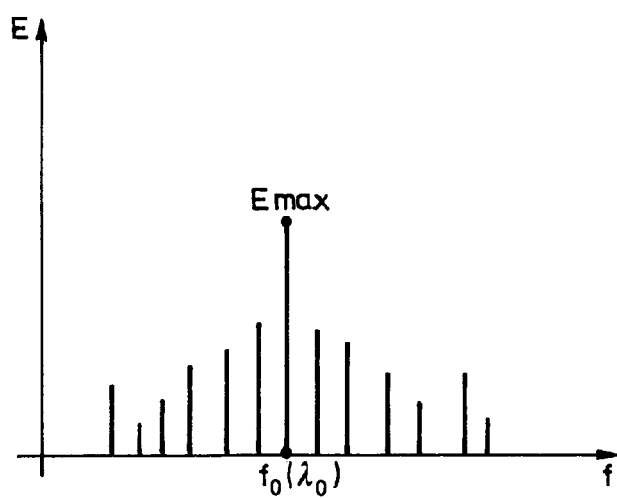
Figures 3, 4:
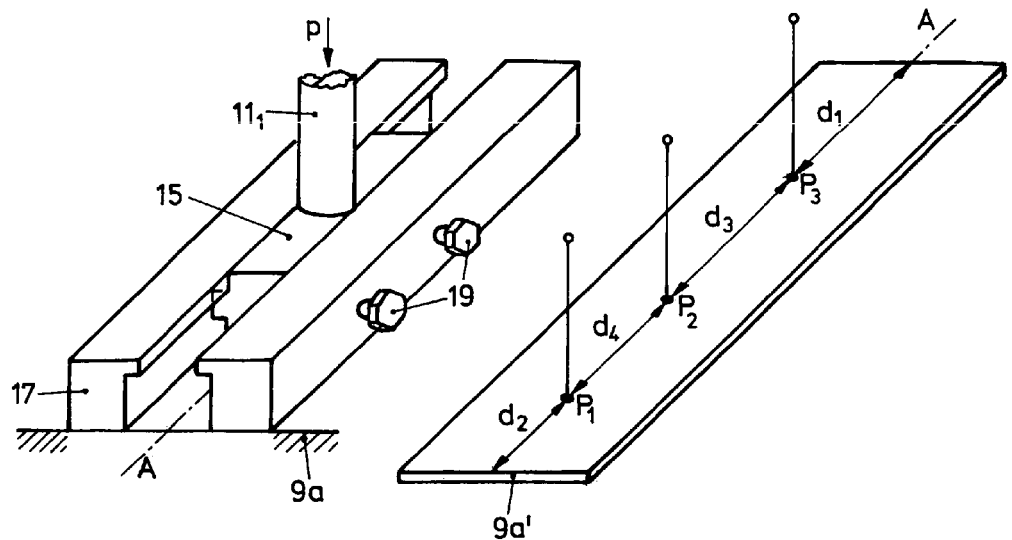
Figure 5:
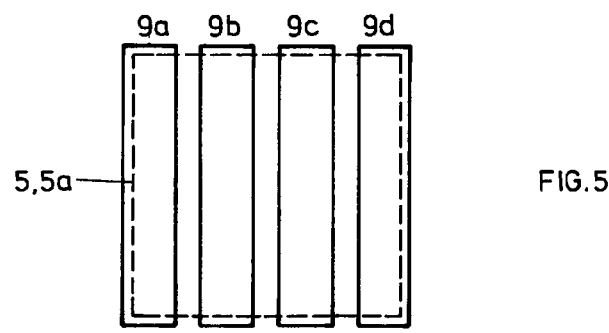
Figure 6:
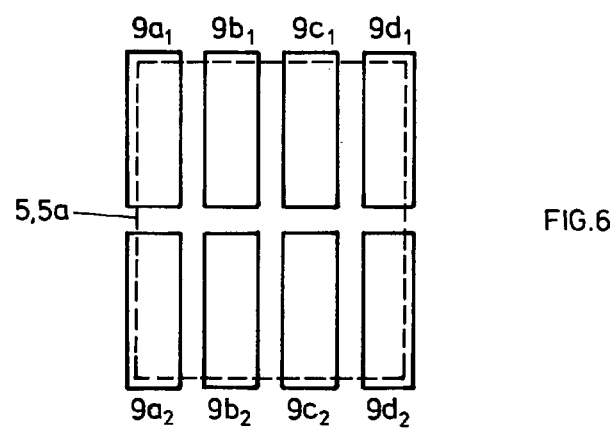
Figure 7:
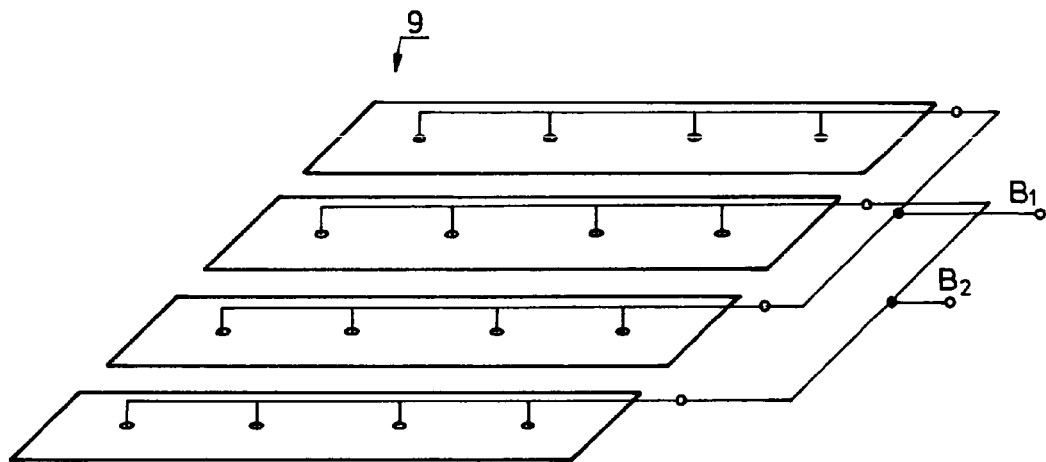
Figure 8:
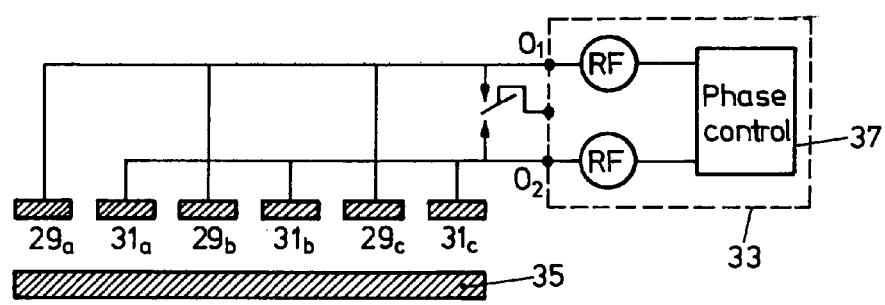
Figure 9:
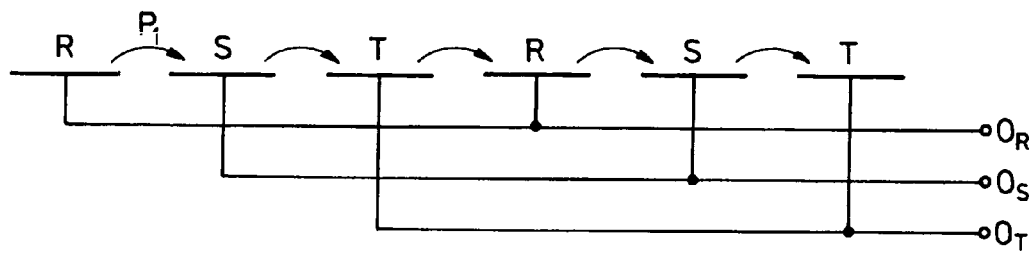
Figure 10:
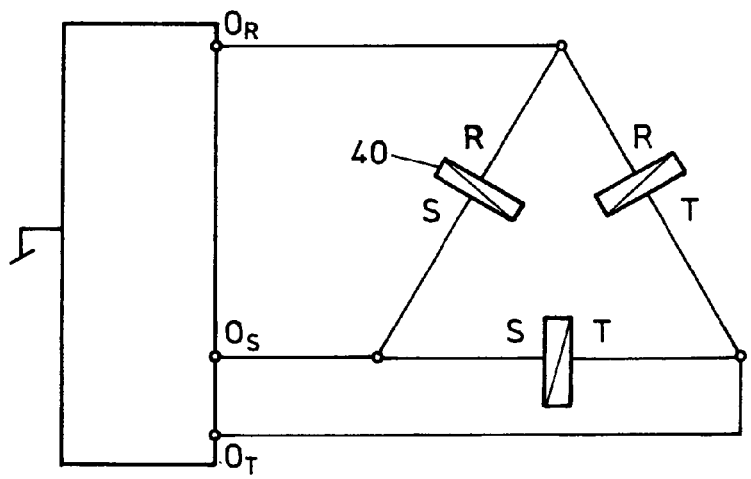
Figure 11:
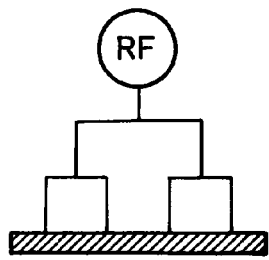

The present invention shall now be further described by means of examples and with the help of figures. Therein show:

FIG. 1 in a schematic perspective view, a minimal configuration of an apparatus according to the present invention, operating the method according to the invention;

FIG. 2 as an example, qualitatively a spectral representation of Rf supply signals for an electrode arrangement as applied according to the present invention;

FIG. 3 in a schematic perspective view, an arrangement of an Rf feed line to a strip electrode according to the invention, whereat the contact locus of the addressed line to the addressed electrode strip is adjustable;

FIG. 4 in a perspective representation in analogy to that of FIG. 1, a single electrode strip as utilized in the frame of the present invention for explaining respective dimensioning rules;

FIG. 5 in a schematic top view, an electrode arrangement according to the present invention;

FIG. 6 in a representation in analogy to that of FIG. 5, a further electrode arrangement for large substrates;

FIG. 7 in a schematic perspective view, four electrode strips of an electrode arrangement as applied in the frame of the present invention, whereby the electrode strips are structured in sub-sets or groups with respect to Rf supply;

FIG. 8 in a schematic representation, Rf supply of the electrode arrangement with two sub-sets of electrode strips according to FIG. 7, whereby the Rf supply signals add to a result signal being substantially zero;

FIG. 9 in a schematic representation, an electrode arrangement as exploited in the frame of the present invention, having three sub-sets of electrode strips;

FIG. 10 most schematically and in a representation different from that of FIG. 9, the three sub-set electrode arrangements being Rf supplied as a three-phase symmetric network;

FIG. 11 a schematic side view onto the length axis of an electrode strip; and

Figure 12:
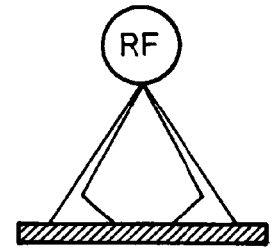

FIG. 12 a schematic side view onto the length axis of an electrode strip.

In FIG. 1 there is shown schematically the basic concept of the apparatus according to the present invention and of the method according to the invention. Within a vacuum recipient 1 there is provided a substrate support 3. A large substrate 5 or, as shown in dash lines at 5a, a multitude of substrates 5a are supported on the substrate support 3. The single substrate 5 or concomitantly all the substrates 5a have a surface o which is to be treated. Customarily, the wall of the recipient 1 is operated on ground potential. The substrate support 3 may be operated on ground potential as well or on another desired electrical potential φ which mostly will be selected to be a DC potential. In a further mode of operation the substrate support 3 may be operated floatingly in the vacuum recipient 1. These possibilities are schematically represented in selection block 7. Opposite to and distant from the surface o there is provided in the vacuum recipient 1 an electrode arrangement 9. The electrode arrangement 9 consists of electrode strips 9a, 9b . . . . The strips 9a, 9b . . . have respective lengths $l_a, l_b$ . . . and widths $w_a, w_b$ . . . . If we define $\bar{l}$ as average length with $$\bar{l} = \frac{\sum_{1}^{n} l_x}{n}$$

wherein n is the number of electrode strips, the individual lengths $l_a, l_b$ . . . differ from $\bar{l}$ by at most ±10%.

The lengths $l_a, l_b$ . . . of the at least two strips 9a and 9b accord substantially with the respective extent L of the single or multiple substrate 5 or 5a on the substrate support 3. Considered in the direction of the width $w_a, w_b$ . . . of the strips 9a, 9b . . . the number of strips is even, whereby for a given surface o to be treated this even number may vary e.g. according to operating Rf frequency, size and distance of the surrounding wall of the recipient 1, from the electrode arrangement 9, the distance between the electrode arrangement 9 and the surface o, the extent of the surface o and the type of Rf plasma to be generated. At least one of the even number of electrode strips, according to FIG. 1 strip 9a, has at least two Rf energy supplies $11_1$ and $11_2$, which are connected to the strip 9a at distinct loci $P_1$ and $P_2$. The loci $P_1, P_2$ are provided along the central length axis $A_a$ of the respective strip 9a.

Under the generic aspect of the present invention at least one or and according to FIG. 1 the one other electrode strip 9b may be supplied with Rf energy via one central supply line 13 or, as an example, via one or more than one Rf supply lines 13a at and along the periphery of strip 9b as shown in dash line in FIG. 1.

The Rf energies which are supplied to the multiple Rf supply loci of strip 9a are equal, although phasing of the respective Rf voltages and currents may be selected to be different.

In FIG. 2 there is shown, for explanation purposes, the distribution of spectral lines of electric Rf energy supplied to the respective Rf supply loci $P_a, P_b$ . . . of FIG. 1. There is present one spectral line at a frequency $f_o$ which has maximum energy E max and corresponds to a wavelength $\lambda_o$.

If we establish s as the average of all the mutual distances of the supply loci according to the example of FIG. 4

$$S = \frac{d3 + d4}{2}$$

and according to FIG. 1:

$S = d_o$

For optimum homogeneous treatment of the surface o the following rule is to be observed:

$d_1 = s/2 \pm 10\%$ and $d_2 = s/2 \pm 10\%$ whereby $d_1$ and $d_2$ indicate the respective distances between the outermost Rf supply loci and the respective small edges of the strip 9.

Thereby and considering wavelength $\lambda_o$ corresponding to frequency $f_o$ as was explained in context with FIG. 2, additionally the following rule is to be fulfilled for optimum homogeneity of the treatment of surface o:

$0 < s \leq 1/10 \lambda_o$ and/or $0 < w_x \leq 1/10 \lambda_o$.

As further schematically shown in FIG. 1 by the double-arrow q, the location of the Rf supply loci $P_a, P_b$ along axis $A_a$, but possibly also in direction perpendicularly thereto, is adjustable. FIG. 3 schematically shows an arrangement for such adjustment, whereat the respective Rf supply line e.g. $11_1$ of FIG. 1 is mounted to slide 15 which is guided in respective guiding members 17 mounted to the surface of electrode strip 9a. The slide 15 may be fixed in a desired position, e.g. by screws 19. Electrical contact of the Rf supply line 11a to the surface of strip 9a may be realized by screwing down supply line 11a as schematically shown by the arrow p.

As was addressed and with an eye on the electrode arrangement 9 FIG. 1 shows the minimum concept according to the present invention. Especially for substrate surfaces o which have a larger extent in direction of the length extent parallel to axis A of the strips, more than two distinct Rf supply loci and respective Rf supply lines are provided as schematically shown for an electrode strip 9a' in FIG. 4.

In FIG. 5 there is schematically shown, in a top view, an arrangement of electrode strips $9_a$ to $9_c$ and in FIG. 6 such arrangement with double electrode strip arrangement with double strips $9_{a1}, 9_{a2}; 9_{b1}, 9_{b2}$, etc. if the extent of the substrate 5, 5a in direction of the length extent of the strips is very large.

In FIG. 7 there is schematically shown an electrode arrangement 9 according to the present invention with four electrode strips. Each of the electrode strips is Rf supplied at four distinct Rf supply loci. As may be seen from the embodiment of FIG. 7 the electrode strips are grouped in sub-sets and each sub-set is fed by an Rf supply input $B_1, B_2$. Thereby, for utmost simplicity as well as utmost homogeneous treatment of the substrate surface o of FIG. 1 all the lines from the supply input points $B_1, B_2$ of Rf energy to the Rf supply loci should be substantially equal. This makes sure that all the Rf supply loci are supplied with Rf energy of substantially equal magnitude and that there is substantially no mutual phasing between Rf voltages or Rf currents supplied to the addressed Rf supply loci.

FIGS. 11 and 12 both show a schematic side view onto the length axis of an electrode strip, each illustrating an example of how to realize equal lengths of all the lines connecting the Rf supply with the respective loci on the electrode strip.

Whenever the electrode strips are operated structured in two or more than two sub-sets the overall arrangement of electrode strips may be electrically operated as a two- or as a multi-phase system. Thereby, the significant advantage is reached that no Rf current return path via substrate support or via the wall of the vacuum recipient is necessary.

According to FIG. 8 there is provided an electrode arrangement with two sub-sets of electrode strips. The first sub-set is formed by electrode strips $29_a, 29_b, 29_c$, whereas the second subset is formed by electrode strips $30_a$-$31_c$. The electrode strips are each Rf supplied at two or more than two Rf supply loci as was explained in context with FIG. 1-5.

An Rf supply generator 33 generates at two Rf outputs $O_1$ and $O_2$ Rf supply signals which are symmetrical with respect to a reference DC potential, as shown in FIG. 8 to ground potential. Being symmetrical means that the two Rf signals appearing at the outputs $O_1$ and $O_2$ are at least substantially in anti-phase relation. If these signals are added, a zero signal results.

Thus, the generator arrangement 33 with the electrode arrangement consisting of the two sub-sets of electrode strips provides for a completely closed Rf current loop, thereby avoiding that Rf currents are flowing back to the generator arrangement via substrate 35 or (not shown) vacuum recipient wall. Thereby, the addressed current loop is closed via the respective plasma discharges which are formed between neighboring electrode strips. By means of a phase control unit 37 the mutual phase relation of the electrical signals output at the outputs $O_1$ and $O_2$ may be adjusted and the two signals e.g. phase-locked by means of a phase-lock loop of the generator 33.

In FIG. 9 there is schematically shown a further embodiment whereat the electrode arrangement consists of three sub-sets of electrode strips addressed by R, S, T respectively. The three electrode strip sub-sets R, S, T are respectively supplied by three-phase outputs $O_R$ to $O_T$ of a generator arrangement. The arrows $P_1$ in FIG. 9 schematically show the Rf plasma discharges which are generated between respective pairs of the subsets R/S; S/T; T/R.

In FIG. 10 the arrangement of FIG. 9 is shown in an electrically more common representation, wherein the impedance elements 40 represent the plasma discharges between electrode strips of the respective sub-sets as shown in FIG. 9. From FIG. 10 it becomes clear that due to highly balanced supply of the subsets no Rf backcurrent path is to be established via a substrate and/or via the wall of the vacuum recipient.

DIMENSIONING EXAMPLES

Assuming the frequency of Rf signals at which, with an eye on FIG. 2, maximum energy is present is 40.68 MHz. This frequency $f_o$ corresponds—in the free space wavelength approximation ($\lambda_o \approx \lambda_o^* = c/f_o$; with c=speed of light in vacuum)—to a wavelength $\lambda_o$ of 7.4 m. Thus, the width w of the electrode strips is selected to be 0.7 m.

For an electrode strip up to a length of 0.7 m, one central Rf supply loci is needed.

For an electrode strip up to a length of 1.4 m, two Rf supply loci are needed with a mutual distance of 0.7 m and a distance to the short edges of the strips of 0.35 m.

For electrode strips up to a length of 2.8 m four Rf supply loci are needed having a mutual distance of 0.7 m and a spacing to the short edge of the strips of 0.35 m.

Further, so as to create a uniform treatment of a substrate surface o according to FIG. 1 with size of 1.4×1.4 m at least two strips are required.

By the present invention, it becomes possible to treat large-substrate surfaces of at least 1 m² with a highly homogeneous treatment distribution along the surface, thereby treating the overall surface at a time and thus providing for a high throughput. The invention is especially suited for layer deposition upon such substrate surfaces, thereby especially by plasma-enhanced chemical vapor deposition as for the production of solar cells based on silicon material.

The invention claimed is:

1. A method for manufacturing vacuum plasma treated substrates comprising:
    exposing in a vacuum recipient a substrate surface of at least 1 m2 to be treated to a substantially plane and distant electrode pattern comprising of an even number of parallel, mutually distant electrode strips of substantially equal length,
    supplying Rf plasma discharge energy to at least one of said strips at least two distinct loci along the length axis of said at least one strip,
    treating said substrate by a plasma established with said electrode pattern, and
    selecting said loci along said length axis to have an average of mutual distances, the outermost of said at least two loci being distant from the small edges of the strip by s/2+20%, wherein the loci along said length axis are chosen to achieve a homogeneous surface treatment on substrate.

2. The method of claim 1, comprising at least three of said loci along said axis, the mutual distances of said points differing from average s by at most 20% of said average.

3. The method of claim 1, said points being provided along the length axis of at least two of said strips, preferably along the length axes of at least a predominant number of said strips.

4. The method of claim 1, comprising generating said plasma discharge energy with a maximum energy at a predetermined frequency $f_o$, at least one of said average s and a width of said strips being selected to be at most $\frac{1}{10}\lambda_o$, wherein $\lambda_o$ is the wavelength corresponding to the frequency $f_o$.

5. The method of claim 1, comprising adjusting location of said loci.

6. The method of claim 1, comprising subdividing said strips in at least two subsets of strips and supplying the strips of said subsets with electric Rf signals respectively which add substantially to a zero signal.

7. The method of claim 1, said plasma treating being non-reactive or reactive etching or layer deposition.

8. The method of claim 7, said layer deposition being PECVD.

9. The method of claim 1, wherein s is an average of mutual distances of the loci where Rf plasma discharge energy is supplied along the length axis of said at least one strip.

10. The method of claim 1, further comprising:
    operating a substrate support that is attached to the substrate at a ground potential or a DC potential.

11. The method of claim 1, further comprising:
    supplying Rf plasma discharge energy to one of said mutually distant electrode strips at at least two distinct loci along the length axis of said one of said mutually distant electrode strips.

12. A method for manufacturing vacuum plasma treated substrates comprising:
    exposing in a vacuum recipient a substrate surface of at least 1 m² to be treated to a substantially plane and distant electrode pattern comprising of $N_e$ parallel, mutually distant electrode strips of substantially equal length,
    supplying Rf plasma discharge energy to at least one of said strips at at least two distinct loci along the length axis of said at least one strip,
    treating said substrate by a plasma established with said electrode pattern, wherein the Rf is supplied in an odd number of phases, and wherein $N_e$ is an integer multiple of the number of phases.

* * * * *